(12) United States Patent
Liu

(10) Patent No.: US 12,265,116 B2
(45) Date of Patent: Apr. 1, 2025

(54) DEVICE AND METHOD FOR DETECTING LIGHT-EMITTING DIODE

(71) Applicant: Century Technology (Shenzhen) Corporation Limited, Shenzhen (CN)

(72) Inventor: Kuang-Hua Liu, Shenzhen (CN)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 111 days.

(21) Appl. No.: 18/127,541

(22) Filed: Mar. 28, 2023

(65) Prior Publication Data

US 2023/0341455 A1 Oct. 26, 2023

(30) Foreign Application Priority Data

Apr. 22, 2022 (CN) .......................... 202210430435.4

(51) Int. Cl.
*G01R 31/26* (2020.01)
*G01N 21/95* (2006.01)

(52) U.S. Cl.
CPC ......... *G01R 31/2635* (2013.01); *G01N 21/95* (2013.01)

(58) Field of Classification Search
CPC ........................... G01R 31/2635; G01N 21/95
See application file for complete search history.

(56) References Cited

U.S. PATENT DOCUMENTS

| 6,204,074 | B1 * | 3/2001 | Bertolet | .................. H01L 24/02 438/18 |
| 2021/0066562 | A1 * | 3/2021 | Hsieh | ..................... H01L 24/743 |

FOREIGN PATENT DOCUMENTS

| CN | 104678274 A | 6/2015 |
| CN | 111969097 A | 11/2020 |

* cited by examiner

*Primary Examiner* — Reena Aurora
(74) *Attorney, Agent, or Firm* — ScienBiziP, P.C.

(57) ABSTRACT

A device and a method for detecting LEDs bonded to a display substrate are provided. The device includes a power supply assembly, a pressure fixture and a detector. The power supply assembly is used for providing electrical signals to the LEDs. The pressure fixture is used for applying a force to the power supply assembly, so that the power supply assembly directly contacts and electrically connects to at least one of the LEDs. The detector is on a side of the pressure fixture away from the power supply assembly and used for detecting whether each of the LEDs emits light according to a normal standard.

19 Claims, 4 Drawing Sheets

DEVICE AND METHOD FOR DETECTING LIGHT-EMITTING DIODE

FIELD

The subject matter herein generally relates to the field of display, specifically a device for detecting light-emitting diodes (LEDs) and a method for detecting LEDs.

BACKGROUND

Existing technologies for detecting LEDs generally include photoluminescence detection technology and electroluminescence detection technology. Specifically, the photoluminescence detection technology irradiates a high-energy laser on a LED, and checks whether the LED emits light under the irradiation of high-energy laser by an optical system, thereby determining the quality of the LED. The electroluminescence detection technology provides electrical signals to electrodes of the LEDs by probes to determine whether the LEDs are electrically connected. However, the devices used in photoluminescence detection technology such as high-energy laser sources, optical systems, and sensors, may be expensive and difficult to maintain. The electroluminescence detection technology is limited by the size of the probes in an electroluminescent detection device. Usually, the minimum pitch between two adjacent probes is about 100 μm to 300 μm, which cannot be used for high-precision detection. That is, if the pitch between two adjacent LEDs is less than the minimum pitch between the probes, the electroluminescent detection device cannot work.

Therefore, there is room for improvement in the art.

BRIEF DESCRIPTION OF THE DRAWINGS

Implementations of the present disclosure will now be described, by way of embodiment, with reference to the attached figures.

DETAILED DESCRIPTION

Figure 1:
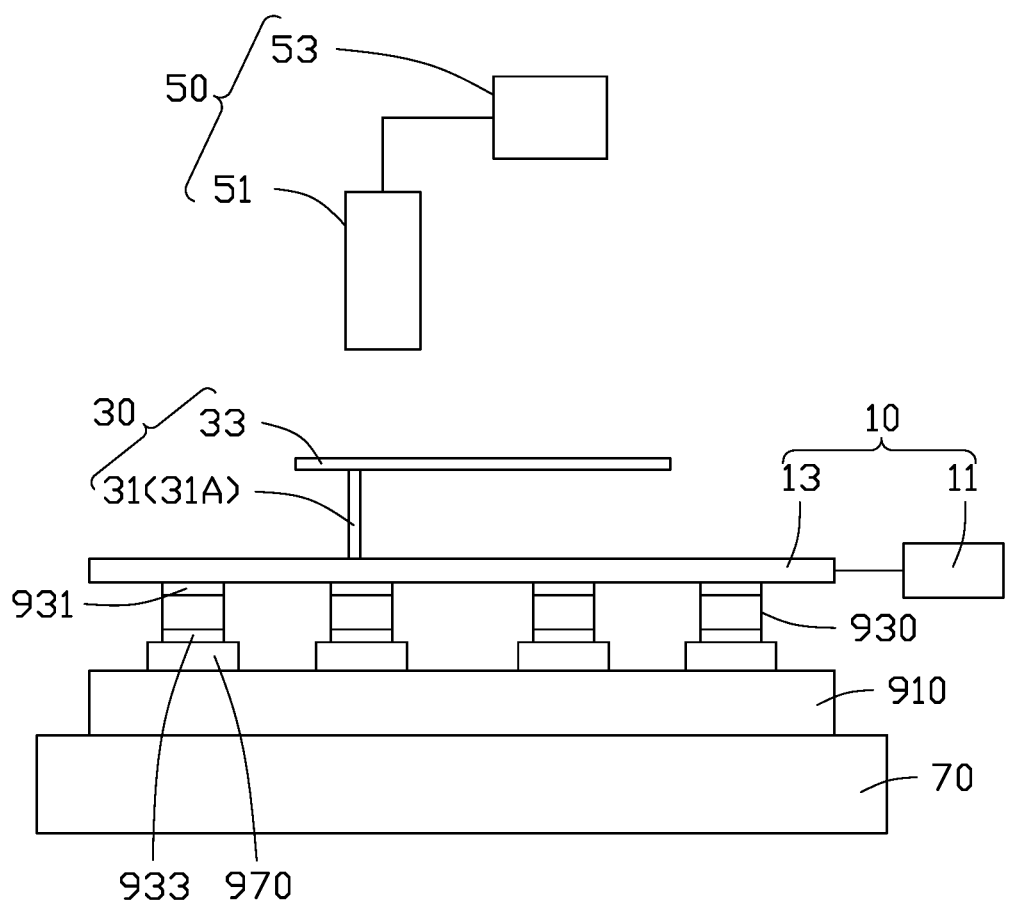
FIG. 1 is a structural view of a device for detecting LEDs according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". The term "circuit" is defined as an integrated circuit (IC) with a plurality of electric elements, such as capacitors, resistors, amplifiers, and the like.

FIG. 1 shows a device 100 for detecting light-emitting diodes (LEDs) according to an embodiment of the present disclosure. The device 100 is configured to detect a plurality of LEDs 930 bonded to a display substrate 910. The display substrate 910 includes a circuit (not shown), and the LEDs 930 are electrically connected to the circuit of the display substrate 910. The device 100 includes a power supply assembly 10, a pressure fixture 30, a detector 50, and a stage 70. The power supply assembly 10 is configured to provide electrical signals to the LEDs 930. The pressure fixture 30 is configured to apply a force to the power supply assembly 10, so that the power supply assembly 10 directly contacts and electrically connects to at least one of the LEDs 930 after being pressed. The detector 50 is on a side of the pressure fixture 30 away from the power supply assembly 10 for detecting whether the LEDs 930 emit light according to a normal standard.

Each LED 930 is a vertical inorganic LED, and includes a first electrode 933 electrically connected to the display substrate 910 and a second electrode 931 opposite to the first electrode 933. The first electrode 933 of each LED 930 is bonded to the display substrate 910 by an adhesive layer 970. The adhesive layer 970 is a conductive adhesive, such as silver glue, solder paste, indium tin oxide, anisotropic conductive adhesive and so on. The display substrate 910 includes a power supply module (not shown) for electrically connecting with each LED 930 and providing electrical signals to each LED 930. The power supply module includes circuit wiring, driver chips, power source, and so on. Each LED 930 is bonded to the display substrate 910 by the adhesive layer 970, so that the display substrate 910 can supply power to the first electrode 933 of each LED 930.

Figure 2:
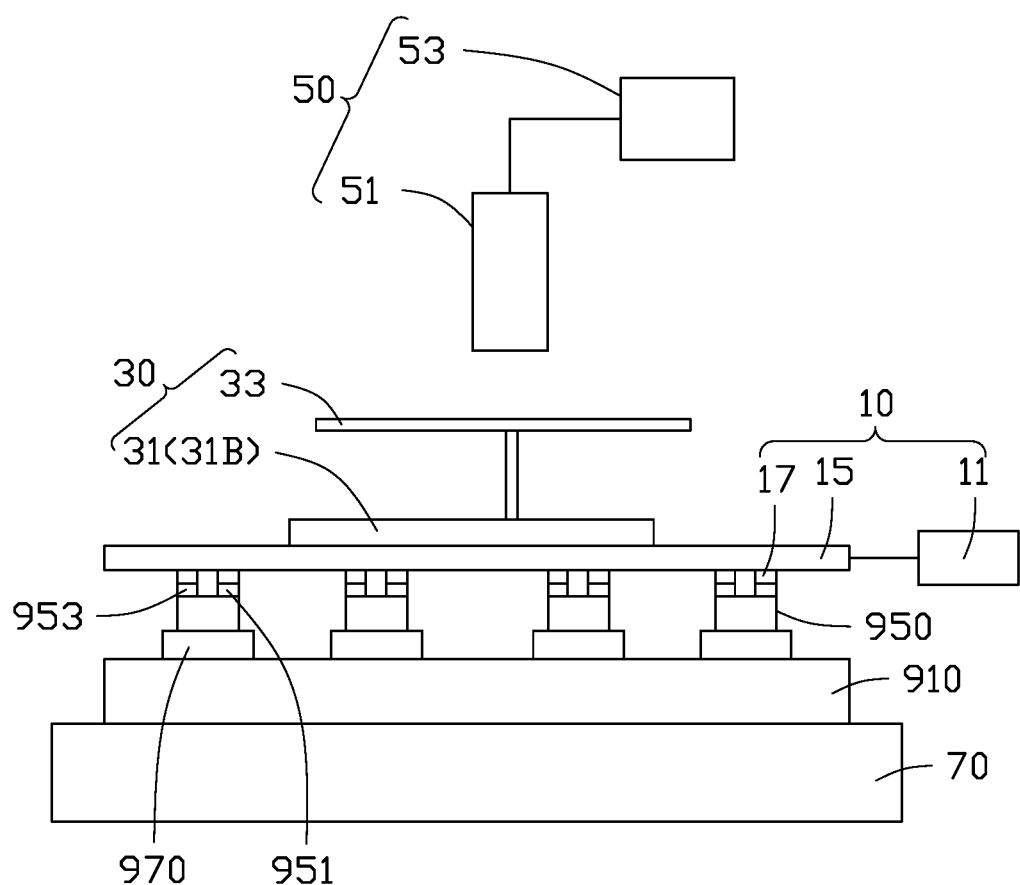
FIG. 2 is a structural view of a device for detecting LEDs according to another embodiment of the present disclosure.

In another embodiment, as shown in FIG. 2, the device 200 is configured to detect a plurality of LEDs 950 bonded to the display substrate 910. Each LED 950 is a front-mounted inorganic LED and includes two electrodes 951 and 953 facing the power supply assembly 10. The display substrate 910 does not supply power to the LEDs 950 and the adhesive layer 970 can be a non-conductive adhesive.

Each LED 930 or 950 may be a micro LED or a miniature LED. That is, a size of each LED 930 or 950 is about 1 μm to 200 μm. The display substrate 910 bonded with LEDs 930 or 950 is a semi-finished product in a process of manufacturing a display device. The display substrate 910 can be used as a backlight source for a liquid crystal display device, or a display panel of a self-luminous display device.

As shown in FIG. 1, the power supply assembly 10 includes a power source 11 and a transparent conductive film 13. The power source 11 is electrically connected to the transparent conductive film 13 and used to supply electrical signals simultaneously to at least two of the LEDs 930 by the transparent conductive film 13. The transparent conductive film 13 is configured to directly contact and electrically connectable to the second electrodes 931 of the LEDs 930 and transmit electrical signals from the power source 11 to the LEDs 930. A material of transparent conductive film 13 includes indium tin oxide or other transparent conductive material. The transparent conductive film 13 may have a size big enough to cover all of the LEDs 930.

The electrode 931 of each LED 930 is electrically connected to the power supply assembly 10, and the electrode 933 of each LED 930 is electrically connected to display substrate 910. Therefore, by controlling the display substrate 910 and the power supply assembly 10 to energize each LED 930, a voltage difference is formed between two electrodes of the LED 930 and the LED 930 emits light.

In another embodiment, as shown in FIG. 2, the power supply assembly 10 includes an insulating transparent substrate 15 and a plurality of connection pads 17 fixed on a surface of the transparent substrate 15. Each connection pad 17 corresponds to one LED 950. Each connection pad 17 is configured to directly contact and electrically connectable a corresponding one of LEDs 950 and transmit electrical signals to the corresponding one of LEDs 950. The power supply assembly 10 further includes conductive lines (not shown) on the transparent substrate 15 for electrically connecting with each connection pad 17 so as to supply power to the connection pads 17 simultaneously or separately.

Specifically, each LED 950 corresponds to two connection pads 17. That is, the electrodes 951 and 953 are electrically connected to two connection pads 17, respectively. Each connection pad 17 is configured to directly contact and electrically connectable to one of the two electrodes 951 and 953 of the corresponding one LEDs 950 and the power source 11. The power source 11 is configured to be electrically connected to the connection pads 17 by the conductive lines to provide the electrical signals to the LEDs 950. The power source 11 can provide the electrical signals to each LED 950 independently or provide the electrical signals to at least two of the LEDs 950 simultaneously, by controlling the voltage output to the connection pads 17. By providing different voltages to the electrodes 951 and 953, a voltage difference for the LED 950 to emit light can be formed. The transparent substrate 15 can be made of a flexible material, so that the connection pads 17 can fully contact with the LEDs 950. A material of the connection pads 17 can be transparent or opaque conductive material. In one embodiment, each connection pad 17 is opaque, and at least part of the LED 950 is not covered by the connection pad 17, so that the light emitted by the LED 950 is transmitted through the transparent substrate 15 and received by the detector 50.

In other embodiments, the connection pads 17 are arranged corresponding to the vertical LEDs 930, and each connection pad 17 is configured to directly contact and electrically connectable to the second electrode 933 of the corresponding one of LEDs 930. A voltage difference is formed between the electrode 931 and the connection pad 17, so that the LED 930 emits light. The present disclosure does not limit the specific structures of the display substrate and the LEDs, as long as each LED is provided with at least one electrode on a side close to the power supply assembly 10, the device for detecting LEDs can be applied.

The power supply assembly 10 including the transparent conductive film 13 and the power supply assembly 10 including the transparent substrate 15 provided with the connection pads 17 can be electrically connected to a plurality of LEDs at the same time without considering the pitch between adjacent LEDs. Specifically, the transparent conductive film 13 is a continuous layer that can directly contact and electrically connectable to each covered LED 930 without considering the pitch between adjacent LEDs 930. The connection pads 17 on the transparent substrate 15 can be arranged according to the pitch between the LEDs 950 on the substrate 910. The structure of each connection pad 17 is simple and easy to be manufactured to match the pitch of the LEDs 950. Therefore, compared with the probes in electroluminescence detection, the measurement accuracy of the transparent substrate 15 provided with the connection pads 17 is higher.

As shown in FIG. 1, the pressure fixture 30 includes at least one pressure head 31 and a mechanical arm 33. The pressure head 31 is sized and shaped such that the power supply assembly 10 directly contacts and electrically connects to at least one LED 930 after the power supply assembly 10 is pressed by the pressure head 31. The inventors of the present disclosure found that since the size of each LEDs 930 and the distance between adjacent LEDs 930 are on the order of microns, even if the softness of the transparent conductive film 13 is improved as much as possible, when the transparent conductive film 13 covers a large number of LEDs 930, there are still gaps between some LEDs 930 and the transparent conductive film 13, resulting in electrical connection failure. In the present disclosure, the pressure fixture 30 makes the transparent conductive film 13 fully contact with the LEDs 930.

The pressure head 31 is sized that the power supply assembly 10 directly contact and electrically connects to at least one of the LEDs 930 after the power supply assembly 10 is pressed by the pressure head 31. The pressure head 31 is detachably mounted on the mechanical arm 33. The mechanical arm 33 is configured to control each of the at least one pressure head 31 to move towards the transparent conductive film 13 and press down the transparent conductive film 13, so that the pressed part of the transparent conductive film 13 contacts and electrically connects with the LEDs 930, so that the power source 11 can supply power to the LEDs 930 through the transparent conductive film 13.

In some embodiments, one or more pressure heads 31 is detachably and replaceably connected to the mechanical arm 33. The size of each pressure head 31 can be different, so that pressure heads 31 of different sizes such that the power supply assembly 10 directly contacts and electrically connects to different numbers or different arrangements of the LEDs 930 after the power supply assembly 10 is pressed by the pressure heads 31. Shapes of the pressure heads 31 of different sizes may be the same or different.

Figure 3:
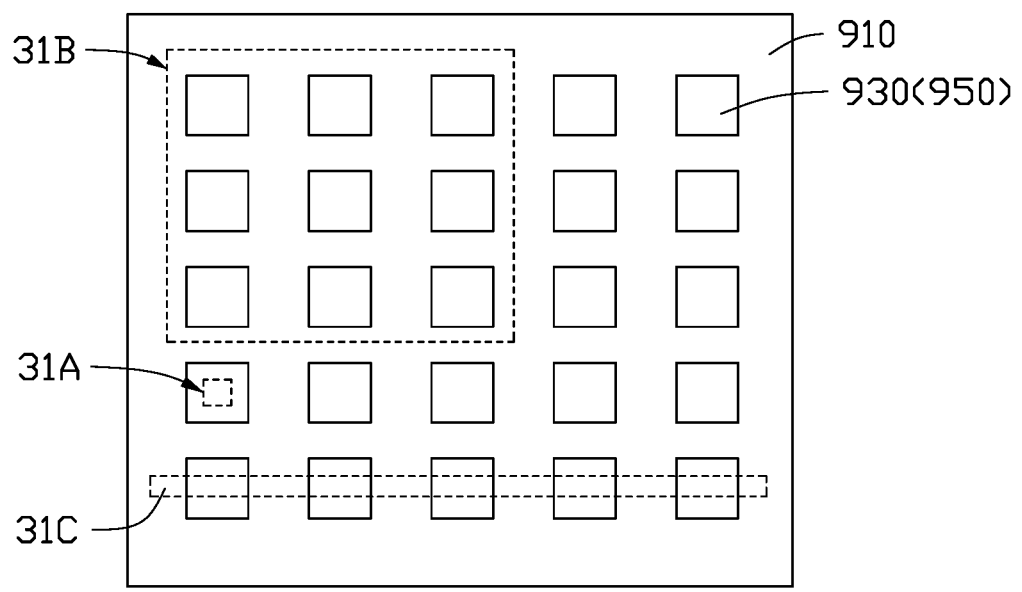
FIG. 3 is a diagram of a working range of a pressure fixture in the device for detecting LEDs according to an embodiment of the present disclosure.
Figure 4:
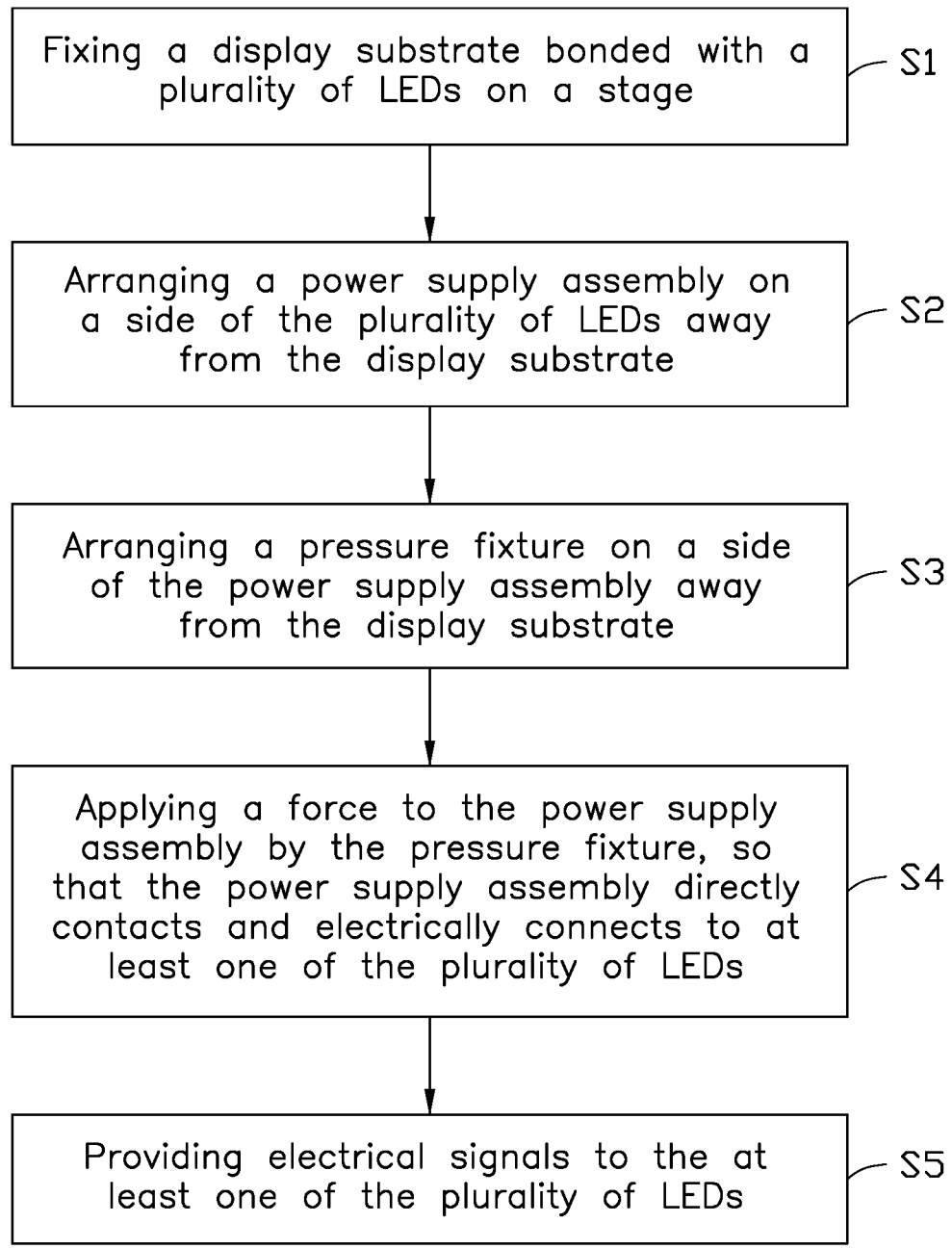
FIG. 4 is a flow chart of a method of detecting LEDs according to an embodiment of the present disclosure.

The pressure head 31A shown in FIG. 1 and FIG. 3 is needle-shaped, which is used to align one LED 930. The pressure head 31B shown in FIG. 2 and FIG. 3 is rectangular, which is used to cover a plurality of LEDs 930 arranged in a matrix of three rows and three columns. The pressure head 31C shown in FIG. 3 is strip-shaped and can cover a plurality of LEDs 930 arranged in the same direction.

The rectangular pressure head 31B can be made of a transparent material, such as glass, plastic, etc., so that the light emitted by the LED 930 can pass through the pressure head 31B and be received by the detector 50. The needle-shaped pressure head 31A or the strip-shaped pressure head 31C can be made of a transparent material and completely cover the LED 930.

Alternatively, the needle-shaped pressure head 31A or the strip-shaped pressure head 31C can be opaque material, and after the pressure head 31A or 31C is pressed down, at least part of each LED 930 is not covered by the pressure head 31A or 31C, so that the light emitted by the LED 930 can be received by the detector 50.

In other embodiments, the pressure head 31 can be of other shapes or sizes, such as cross-shaped, triangular, etc., to cover different arrangements of LEDs 930 on different display substrates 910, or to cover the LEDs within a target range according to requirements.

As shown in FIG. 1, the stage 70 carries and fixes the display substrate 910. Since the size of each LED 930 is on the order of microns, a slight vibration during the detection process can cause a large change in the relative position of the LEDs 930, so the stage 70 can include, for example, a buckle or a vacuum chuck to fix the display substrate 910. Therefore, detection errors caused by the movement of the LEDs 930 during the detection process are avoided.

The detector 50 includes an image sensor 51 and a processor 53 electrically connected to the image sensor 51. The image sensor 51 is used to collect images of the LEDs 930 in a power-on state, and the processor 53 is used to process the image sensor 51 to analyze the collected images and determine whether the LEDs 930 emit light, and then judge the quality of the LEDs 930.

A method for detecting LEDs bonded to a display substrate is disclosed. The method is provided by way of embodiment, as there are a variety of ways to carry out the method. The method described below can be carried out using the configurations illustrated in FIGS. 1 through 4 for example, and various elements of these figures are referenced in explaining the method. Each block in this method represents one or more processes, methods, or subroutines, carried out in the method. Additionally, the illustrated order of blocks is by example only and the order of the blocks can change. The method can begin at block 51.

In block 51, a display substrate bonded with a plurality of LEDs is fixed on a stage. As shown in FIG. 1, the display substrate 910 with LEDs 930 is fixed on the stage 70, such as by buckling or vacuum adsorption, so as to prevent the display substrate 910 from moving relative to the device 100. As shown in FIG. 2, the display substrate 910 with LEDs 950 is fixed on the stage 70.

In block S2, a power supply assembly is arranged on a side of the LEDs away from the display substrate. As shown in FIG. 1, the transparent conductive film 13 of the power supply assembly 10 is placed on a side of the LEDs 930 away from the display substrate 910, and the transparent conductive film 13 covers LEDs 930. Alternatively, as shown in FIG. 2, the transparent substrate 15 is placed on a side of the LEDs 950 away from the display substrate 910, the connection pads 17 face the display substrate 910, and each connection pad 17 is aligned with one LED 950.

In some embodiment, the transparent conductive film 13 or the transparent substrate 15 with the connection pads 17 are not bonded to the display substrate 910, and can continue to be used for the detection work of other display substrates.

In some embodiments, the transparent conductive film 13 or the transparent substrate 15 with the connection pads 17 can be bonded to the display substrate 910, so as to be a component on the display substrate 910 and participate in the manufacturing process of the display device.

In block S3, a pressure fixture is arranged on a side of the power supply assembly away from the display substrate.

Specifically, a pressure head having a size such that the power supply assembly directly contacts and electrically connects to at least one of the plurality of LEDs after the power supply assembly is by the pressure head pressed is selected. According to the quantity and arrangement of the LEDs to be detected, select the pressure head whose shape and size meet the requirements.

For example, when the LED to be detected is a certain LED 930 on the display substrate 910 or some LEDs 930 that are far apart, the needle-shaped pressure head 31A can be selected, and the needle-shaped pressure head 31A can be aligned with the LED to be tested under the control of the mechanical arm 33. When the LEDs to be tested are LEDs in a certain row or column on the display substrate 910, the strip-shaped pressure head 31C can be selected and aligned with the row or column to be detected. When the LEDs to be tested are a plurality of LEDs in a certain area on the display substrate 910, such as a matrix of three rows and three columns, the rectangular pressure head 31B can be selected and aligned with the matrix to be detected. In some embodiments, a pressure head having the same shape and size as that of the display substrate 910 can be selected to directly cover all the LEDs 930.

In block S4, a force is applied by the pressure fixture to the power supply assembly, so that the power supply assembly directly contacts and electrically connects to at least one of the LEDs.

As shown in FIG. 1, the power supply assembly 10 directly contacts and electrically connects to the second electrodes 931 of more than two LEDs after being applied the force. As shown in FIG. 2, the power supply assembly 10 directly contacts and electrically connects to two electrodes 951 and 953 of more than two LEDs after being applied the force.

In blockS5, electrical signals are provided to the LEDs.

Specifically, in blockS5, electrical signals are provided to the two electrodes of a LED. As shown in FIG. 1, for each vertical LED 930, the display substrate 910 and the power supply assembly 10 jointly provide electrical signals to the LED 930. That is, providing the electrical signals to the LEDs 930 includes providing electrical signals by the display substrate 910 and the power supply assembly 10 to the LEDs 930. As shown in FIG. 2, each the front-mounted LED 950, the power supply assembly 10 alone provides electrical signals to the two electrodes of the LED 950. That is, providing the electrical signals to the LEDs 950 includes providing electrical signals by the power supply assembly 10 to the LEDs 950. The electrical signals refer to voltage signals.

Additionally, the power supply assembly 10 can provide electrical signals simultaneously to at least two LEDs 930 by the transparent conductive film 13, and also can provide electrical signals simultaneously to at least two LEDs 950 by the connection pads 17.

The method further includes detecting whether the LED emits light according to a normal standard after providing electrical signals to the LEDs. Specifically, the detector 50 collects images of the LEDs 930 in a power supply state, and judges whether each LED 930 emits light according to the images, thereby judging whether the LEDs 930 work according to a normal standard.

In the device and method for detecting LEDs provided in the present disclosure, the power supply module 10 includes the transparent conductive film 13 connected to the power source 11 or includes the connection pads 17 on the transparent substrate 15 electrically connected to the power source 11. During detection, the transparent conductive film 13 or the surface of the transparent substrate 15 provided with the connection pads 17 covers LEDs on the display substrate, and LEDs can be powered simultaneously, thereby facilitating testing of the quality of LEDs. Compared with the existing electroluminescence detection and photoluminescence detection, the device has a simple structure, saves cost, and does not need to consider the distance between adjacent LEDs. The pressure fixture can ensure that the power supply assembly is fully in contact with the LEDs, avoiding the LEDs not emitting light caused by gaps between the power supply assembly and individual LEDs when the power supply assembly covers LEDs, thereby avoiding detection errors.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. A device configured for detecting a plurality of light-emitting diodes (LEDs) bonded to a display substrate, the device comprising:
   a power supply assembly configured to provide electrical signals to the plurality of LEDs;
   a pressure fixture configured to apply a force to the power supply assembly, so that the power supply assembly directly contacts and electrically connects to at least one of the plurality of LEDs; and
   a detector on a side of the pressure fixture away from the power supply assembly, the detector being configured for collecting images of the plurality of LEDs in a power-on state and determining whether each of the plurality of LEDs emits light according to the images, thereby detecting whether each of the plurality of LEDs emits light according to a normal standard.

2. The device according to claim 1, wherein the power supply assembly comprises a transparent conductive film, and the transparent conductive film is configured to directly contact and electrically connectable to the plurality of LEDs.

3. The device according to claim 2, wherein the transparent conductive film is configured to directly contact and electrically connectable to second electrodes of a plurality of vertical inorganic LEDs.

4. The device according to claim 2, wherein the power supply assembly further comprises a power source, and the power source is configured to be electrically connected to the transparent conductive film and supply the electrical signals simultaneously to at least two of the plurality of LEDs.

5. The device according to claim 2, wherein a material of the transparent conductive film comprises indium tin oxide.

6. The device according to claim 1, wherein the power supply assembly comprises an insulating transparent substrate and a plurality of connection pads fixed on a surface of the transparent substrate, and each of the plurality of connection pads is configured to directly contact and electrically connectable to a corresponding one of the plurality of LEDs.

7. The device according to claim 6, wherein each of the plurality of connection pads is configured to directly contact and electrically connectable to a second electrode of a vertical inorganic LED.

8. The device according to claim 6, wherein each of the plurality of connection pads is configured to directly contact and electrically connectable to an electrode of a front-mounted inorganic of LED.

9. The device according to claim 6, wherein the power supply assembly further comprises a power source, and the power source is configured to be electrically connected to the plurality of connection pads to provide the electrical signals to the plurality of LEDs.

10. The device according to claim 9, wherein the power source is configured to provide the electrical signals to each of the plurality of LEDs independently, or the power source is configured to provide the electrical signals simultaneously to at least two of the plurality of LEDs.

11. The device according to claim 1, further comprising a stage, wherein the stage is configured to carry and fix the display substrate.

12. The device according to claim 1, wherein the pressure fixture comprises at least one pressure head, a size of the at least one pressure head is configured such that the power supply assembly directly contacts and electrically connects to at least one of the plurality of LEDs after the power supply assembly is pressed by the pressure head.

13. The device according to claim 12, wherein the pressure fixture comprises a plurality of the pressure heads of different sizes such that the power supply assembly directly contacts and electrically connects to different numbers of the plurality of LEDs after the power supply assembly is pressed by the plurality of the pressure heads.

14. The device according to claim 12, wherein the pressure fixture further comprises a mechanical arm, the at least one pressure head is detachably mounted on the mechanical arm, and the mechanical arm is configured to control a movement of each of the at least one pressure head.

15. A method for detecting a plurality of light-emitting diodes (LEDs) bonded to a display substrate, the method comprising:
   arranging a power supply assembly on a side of the plurality of LEDs away from the display substrate;
   arranging a pressure fixture on a side of the power supply assembly away from the display substrate;
   applying a force to the power supply assembly by the pressure fixture, so that the power supply assembly directly contacts and electrically connects to at least one of the plurality of LEDs;
   providing electrical signals to the at least one of the plurality of LEDs; and
   collecting images of the plurality of LEDs in a power-on state and determining whether each of the plurality of LEDs emits light according to the images, thereby detecting whether each of the plurality of LEDs emits light according to a normal standard.

16. The method according to claim 15, wherein arranging the pressure fixture comprises selecting a pressure head having a size such that the power supply assembly can directly contact and electrically connects to at least one of the plurality of LEDs after the power supply assembly is pressed by the pressure head.

17. The method according to claim 15, wherein providing the electrical signals to the at least one of the plurality of LEDs comprises providing the electrical signals simultaneously to at least two of the plurality of LEDs by the power supply assembly.

18. The method according to claim 15, wherein each of the plurality of LEDs is a vertical inorganic LED and has a first electrode electrically connected to the display substrate and a second electrode opposite to the first electrode, the power supply assembly directly contacts and electrically connects to the second electrode of the at least one of the plurality of LEDs after the force is applied to the power supply assembly, and providing the electrical signals to the at least one of the plurality of LEDs comprises providing electrical signals by the display substrate and the power supply assembly to the at least one of the plurality of LEDs.

19. The method according to claim 15, wherein each of the plurality of LEDs is a front-mounted inorganic LED, the power supply assembly directly contacts and electrically connects to two electrodes of the at least one of the plurality of LEDs after the force is applied to the power supply assembly, and providing the electrical signals to the at least one of the plurality of LEDs comprises providing electrical signals by the power supply assembly to the at least one of the plurality of LEDs.

* * * * *